(12) United States Patent
Wu

(10) Patent No.: US 6,407,898 B1
(45) Date of Patent: Jun. 18, 2002

(54) PROTECTION MEANS FOR PREVENTING POWER-ON SEQUENCE INDUCED LATCH-UP

(75) Inventor: Chau-neng Wu, Hsinchu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 09/484,488

(22) Filed: Jan. 18, 2000

(51) Int. Cl.$^7$ .................................................. H02H 3/18
(52) U.S. Cl. ........................... 361/86; 327/143; 327/198
(58) Field of Search ................................. 327/321, 531, 327/537, 546, 545, 143, 198; 257/296, 372, 379, 532; 361/86, 92, 100–101

(56) References Cited

U.S. PATENT DOCUMENTS

| | | | |
|---|---|---|---|
| 4,636,658 A | * 1/1987 | Arakawa | 327/321 |
| 4,791,316 A | * 12/1988 | Winnerl et al. | 257/372 |
| 4,871,927 A | * 10/1989 | Dallavalle | 327/546 |
| 5,159,204 A | * 10/1992 | Bernacchi et al. | 327/372 |
| 5,962,902 A | * 10/1999 | Kato et al. | 257/372 |
| 6,157,070 A | * 12/2000 | Lin et al. | 257/392 |

* cited by examiner

*Primary Examiner*—Ronald W. Leja
(74) *Attorney, Agent, or Firm*—Birch, Stewart, Kolasch & Birch, LLP

(57) ABSTRACT

A protection device for preventing power-on sequence induced latch-up, which device is used in a power supply system having a first power supply and a second power supply wherein the voltage of the first power supply is higher than that of the second power supply. The protection device comprising: a voltage-drop circuit having an input terminal and an output terminal, the input terminal being connected to the first power supply; and inverter having an input terminal and an output terminal, the input terminal being connected to the output terminal of the voltage-drop circuit: a switching NMOS transistor with the gate connected to the output terminal of the inverter and the source connected to ground: and a variable capacitance circuit having a first capacitor and a second capacitor, the capacitance of the first capacitor being much larger than that of the second capacitor, the first terminal and the second terminal of the first capacitor being connected to the second power supply and the first terminal of the second capacitor respectively, the second terminal of the second capacitor being connected to ground, the common node of the second terminal of the first capacitor and the first terminal of the second capacitor being connected to the drain of the switching NMOS transistor, wherein the switching NMOS transistor and the variable capacitance circuit are formed on the same semiconductor substrate.

4 Claims, 2 Drawing Sheets

PROTECTION MEANS FOR PREVENTING POWER-ON SEQUENCE INDUCED LATCH-UP

BACKGROUND OF THE INVENTION

1. Field of the Invention

The present invention relates to a protection means for preventing power-on sequence induced latch-up, and more particularly to a protection means for preventing power-on sequence induced latch-up and having low coupling effect of the capacitor and adapted to be integrated with other semiconductor devices on the same semiconductor substrate.

2. Description of the Related Art

In a CMOS, the latch-up effect always bothers many layout designers because the effect can cause the device failure temporarily or even forever and can affect the reliability of devices in the CMOS.

In the application of CMOS's with multiple power sources, the power-on sequence is one possible cause that induces the latch-up effect. The latch-up effect induced by power-on sequence and conventional methods for preventing the latch-up effect will now be described.

Referring to FIG. 1, the N-well and its overlaying layers of a conventional CMOS comprises a p-type substrate 11, an N-well 12, the source 13 of PMOS that is electrically connected to a second power supply VDD2, and an $N_+$ region 14 that connects the N-well 12 to a first power supply VDD1. In this structure, the voltage of VDD1 must be higher than that of VDD2 to prevent the pn junction between source 13 and $N_+$ region 14 from being forward biased.

However, when the device as described above operates, some problems can be caused by the power-on sequence. For example, in the normal operation mode, if the power of VDD2 is provided before that of VDD1, the pn junction between source 13 and $N_+$ region 14 is always reverse biased when a voltage is applied to the source 13. Therefore, the operation of the CMOS is normal without power-on sequence induced latch-up effect. However, if the power of VDD1 is provided before that of VDD2, the pn junction between source 13 and $N_+$ region 14 is forward biased for a short period of time after a voltage is applied to the $N_+$ region 14. For example, if the voltage of VDD1 is 3.3V and that of VDD2 is 2.5V, it can take a short period of time, for example about several mini seconds, for the voltage of $N_+$ region 14 VDD1 to reach the maximum value of 3.3V, as shown in FIG. 2. When the voltage of VDD1 is lower than that of VDD2 minus the forward bias of pn junction (about 2.0V in general), i.e. when VDD1 is applied for the initial time period of T1 as shown in FIG. 2, the pn junction between the source 13 and the $N_+$ region 14 is forward biased.

As described above, when the voltage of VDD1 is lower than that of VDD2 minus the forward bias of pn junction, the pn junction between the source 13 and the $N_+$ region 14 is forward biased. Therefore, a forward current flows across the junction of $P^+/N$, and triggers the thyristor composed of parasitic transistor pnp and npn of the CMOS to turn on. This is the so-called latch-up effect and causes the failure of the CMOS device.

There are two conventional methods for preventing the latch-up effect. One of the m methods uses a resistor located and connected between the power supply of VDD1 and the corresponding pin of IC in order to limit the current flowing into the CMOS device so that the latch-up effect can be avoided. The other methods uses a capacitor located and connected between the power supply of VDD1 and the ground pin of IC in order to share a part of electric charge and make the current flowing into the CMOS device incapable of triggering the latch-up effect.

However, both of these two conventional methods for preventing power-on sequence induced latch-up effect use elements such as a resistor or a capacitor that is formed on the printed circuit board (PCB) and is not integrated in the same semiconductor substrate with the CMOS. Obviously, it is unsuitable for practical application. Furthermore, another disadvantage of these two conventional methods lies in that the external resistor or capacitor can make the circuit in IC unstable due to electromagnetic coupling.

SUMMARY OF THE INVENTION

Accordingly, an object of the present invention is to provide a protection means for preventing power-on sequence induced latch-up effect. The protection means has low capacitor coupling effect and is suitable to be integrated with other semiconductor device in the same semiconductor substrate.

To achieve the above-mentioned object, protection means for preventing power-on sequence induced latch-up is provided. The protection means is used in a power supply system having a first power supply and a second power supply wherein the voltage of the first power supply is higher than that of the second power supply. The protection means comprises:

a voltage-drop circuit having an input terminal and an output terminal, the input terminal being connected to the first power supply;

an inverter having an input terminal and an output terminal, the input terminal being connected to the output terminal of said voltage-drop circuit;

a switching NMOS transistor with the gate connected to the output terminal of said inverter and the source connected to ground; and a variable capacitance circuit having a first capacitor and a second capacitor, the capacitance of the first capacitor being much larger than that of the second capacitor, the first terminal and the second terminal of the first capacitor being connected to the second power supply and the first terminal of the second capacitor respectively, the second terminal of the second capacitor being connected to ground, the common node of the second terminal of the first capacitor and the first terminal of the second capacitor being connected to the drain of said switching NMOS transistor, wherein said switching NMOS transistor and said variable capacitance circuit are formed on the same semiconductor substrate.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

The protection means for preventing power-on sequence induced latch-up effect of the present invention will be described herein with reference to the attached drawings. For explanation, it is assumed that the voltage of a first power supply VDD1 is 3.3V and that of a second power supply VDD2 is 2.5V.

Figure 3:
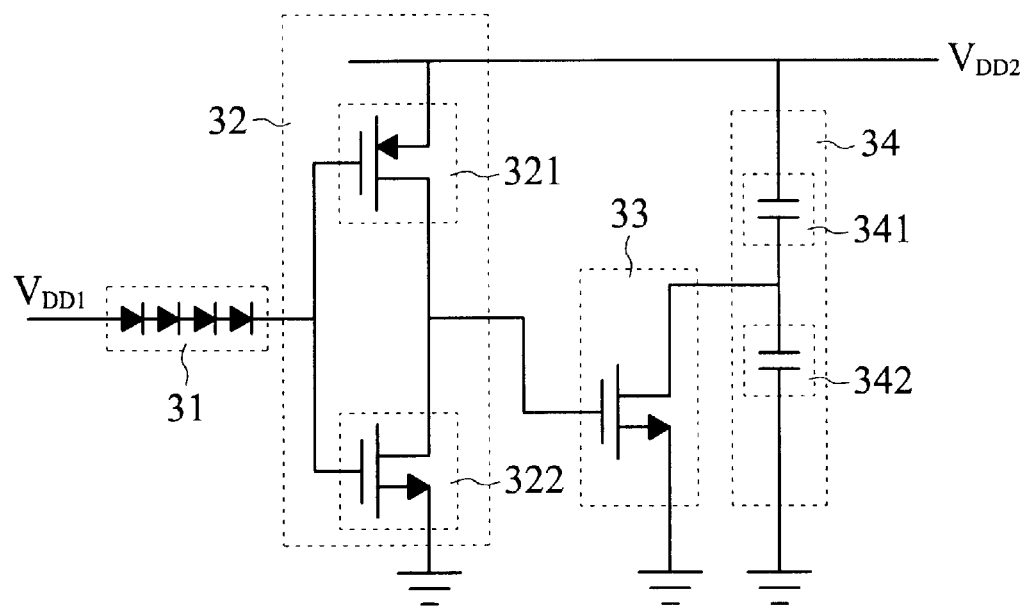
FIG. 3 is a circuit diagram of protection means for preventing the power-on sequence induced latch-up in accordance with a preferred embodiment of the invention.

Referring to FIG. 3, the protection means for preventing power-on sequence induced latch-up effect in accordance with a preferred embodiment of the invention comprises: a set of diodes 31 including four series-connected diodes wherein the p node of the first diode is connected to the first power supply VDD1; an inverter 32 composed of a CMOS wherein the source of the PMOS 321 is electrically connected to the second power supply VDD2, the source of the NMOS 322 is electrically connected to ground, and the common node of the gates of PMOS 321 and NMOS 322 (i.e. the input of the inverter 32) is electrically connected to the n node of the last diode of the set of diodes 31; an NMOS 33 wherein the gate is electrically connected to the output of the inverter 32 (i.e. the common node of the drain of the PMOS 321 and the drain of the NMOS 322) and the source is electrically connected to ground; and a pair of capacitors including a first capacitor 341 and a second capacitor 342 wherein the capacitance of the first capacitor 341 is much greater than that of the second capacitor 342, the first end of the first capacitor 341 is electrically connected to VDD2 and the second end is electrically connected to the first end of the second capacitor 342, the second end of the second capacitor 342 is electrically connected to ground, and the common node of the second end of the first capacitor 341 and the first end of the second capacitor 342 is electrically connected to the drain of NMOS 33.

The operation of the circuit as shown in FIG. 3 will be described as follows.

In normal condition, when only the first power supply VDD1 (=3.3V) is provided, the circuit as shown in FIG. 3 does not operate due to lack of VDD2. When the second power supply VDD2 (=2.5V) is provided additionally, the set of diodes 31 contribute a voltage drop about 2.0V and the NMOS 322 is turned-on. Therefore, the output of the inverter 32 is the ground voltage 0V and the NMOS 33 is in the cut-off state so that the VDD2 is connected to ground through the first capacitor 341 and the second capacitor 342. As described above, the circuit shown in FIG. 3 does not affect the operation of VDD1 and VDD2 in this normal condition.

Figure 1:
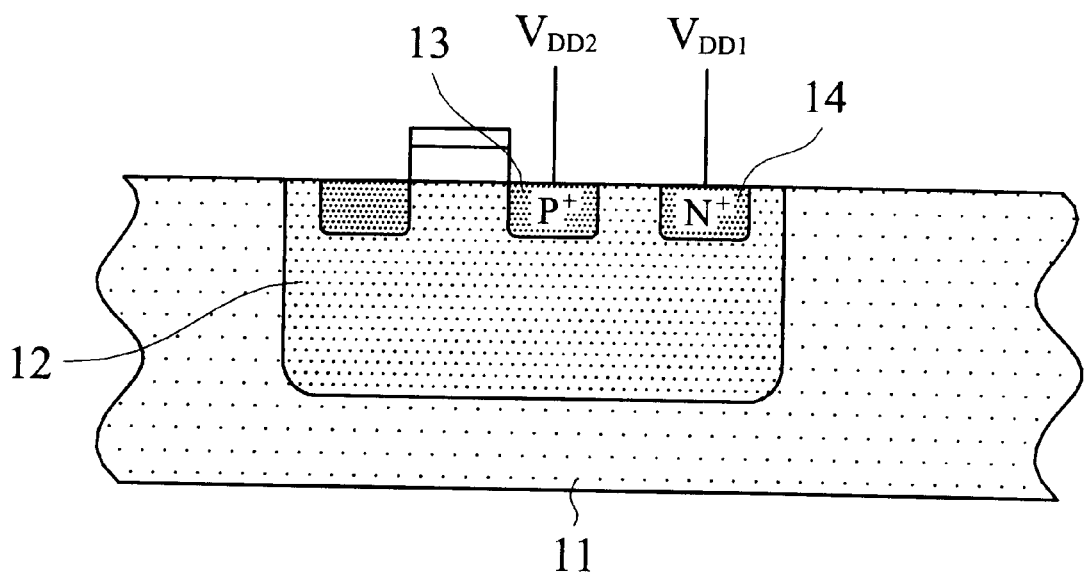
FIG. 1 is a schematic diagram of the N-well and the layers overlaying the N-well in a CMOS.
Figure 2:
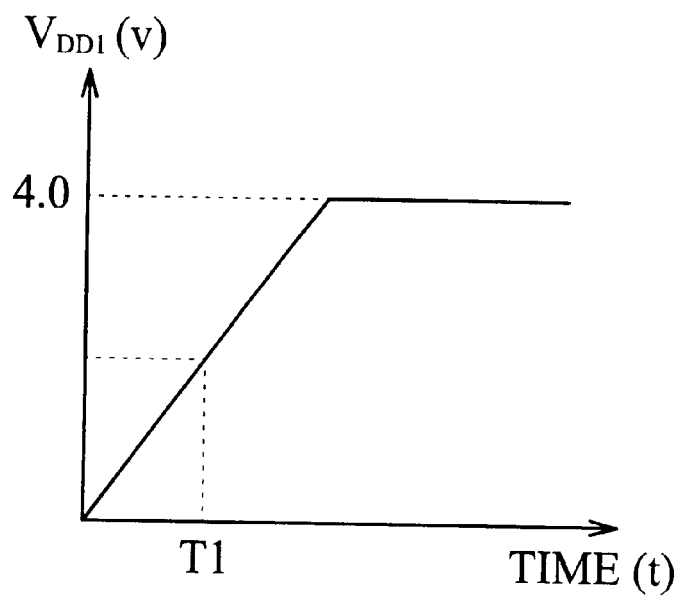
FIG. 2 shows the relation between the voltage and time when the first power supply is suddenly provided.

On the contrary, when only the second power supply VDD2 (=2.5V) is provided, the voltage VDD2 is connected to ground through the first capacitor 341 and the second capacitor 342. Afterward, when VDD1 is provided additionally and initially the voltage of VDD1 does not exceed 2.0V (i.e. the period of time when t≦T1 in FIG. 2), the voltage 2.0V is insufficient to forward bias the set of diodes 31 and thus the input of inverter 32 is the ground voltage 0V. Accordingly, the output of the inverter 32 is about 2.5V and it turns on the NMOS 33 so that the second capacitor 342 is bypassed by the NMOS 33. Therefore, VDD2 is connected to ground through the first capacitor 341 having quite large capacitance. Due to the large capacitance of the first capacitor 341, the current flowing into the CMOS is limited and insufficient to trigger the latch-up effect. When the voltage of VDD1 reaches 2.5V, it forward biases the set of diodes 31 and the input voltage of the inverter 32 is larger than 0.5V so that the NMOS 322 is turned-on. Therefore, the output of the inverter 32 is the ground voltage 0V and NMOS 33 is cut-off so that the VDD2 is connected to ground through series-connected first capacitor 341 and second capacitor 342.

As described above, when VDD1 is suddenly supplied and initially the voltage of VDD1 is lower than the voltage of VDD2, VDD2 is connected to ground through the first capacitor 341 having quite large capacitance. Therefore, the current flowing into the device is limited and is insufficient to trigger the latch-up effect. Subsequently, when the voltage of VDD1 is larger than the voltage of VDD2 (i.e. t>T1 in FIG. 2), VDD2 is connected to ground through the series-connected first capacitor 341 and second capacitor 342. The capacitance of the series-connected first capacitor 341 and second capacitor 342 is determined by the capacitance of the second capacitor 342, which is much smaller than the capacitance of first capacitor 341. Therefore, the coupling effect from the capacitance to the circuit is effectively decreased.

Figure 4:
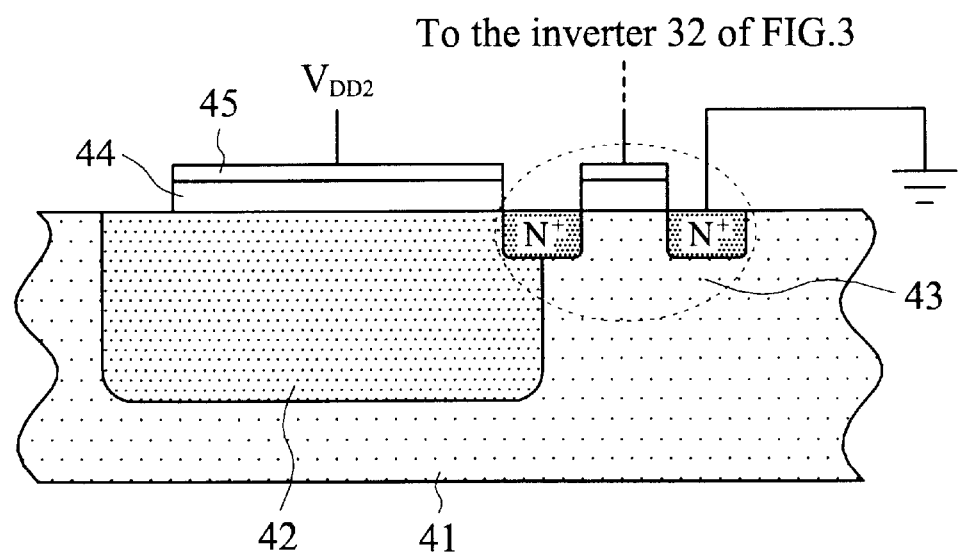
FIG. 4 shows the structure of the NMOS 33 and the set of capacitors 34 as shown in FIG. 3.

Referring to FIG. 4, a semiconductor structure of NMOS 33 and the pair of capacitors 341, 342 as shown in FIG. 3 comprises: a p-type substrate 41; an N-well 42 formed on the substrate 41; an NMOS transistor 43 formed on the substrate 41 wherein the source is electrically connected to ground, the gate is electrically connected to the output of the inverter 32 of FIG. 3, and the drain diffusion layer is formed across the pn junction between the p-type substrate 41 and the N-well 42; a gate dielectric 44 formed on the N-well 42; and a gate electrode 45 formed on the gate dielectric 44 and electrically connected to the second power supply VDD2.

Referring to FIG. 4, the gate electrode 45, the gate dielectric 44, and the N-well 42 together form a gate capacitor, which corresponds to the capacitor 341 shown in FIG. 3. In addition, the junction between the N-well 42 and the p-type substrate 41 form a depletion region that can be considered as another capacitor in a reverse biased operation, which corresponds to the capacitor 342 shown in FIG. 3. When the NMOS 43 is turned-on, a current channel is formed between the drain and the source so that the depletion capacitor between N-well 42 and p-type substrate 41 is bypassed. When the NMOS 43 is cut-off, the equivalent capacitance is the series-connected capacitance of the gate capacitor (45, 44, 42) and depletion capacitor (42, 41). The capacitance of the depletion capacitor (42, 41) is much smaller than that of the gate capacitor (45, 44, 42), so the equivalent capacitance is much smaller. Therefore, the coupling effect with other circuit is substantially reduced.

It is-obvious to those skilled in the art that the inverter of the invention can be implemented by other circuits besides CMOS.

Furthermore, any circuits that are capable of achieving a voltage-drop can be used to replace the set of diodes 31.

What is claimed is:

1. A protection means for preventing power-on sequence induced latch-up, the protection means being for use in a power supply system having a first power supply and a second power supply wherein the voltage of the first power supply is higher than that of the second power supply, the protection means comprising:

a voltage-drop circuit having an input terminal and an output terminal, the input terminal being connected to the first power supply;

an inverter having an input terminal and an output terminal, the input terminal being connected to the output terminal of said voltage-drop circuit;

a switching NMOS transistor with the gate connected to the output terminal of said inverter and the source connected to ground; and a variable capacitance circuit having a first capacitor and a second capacitor, the capacitance of the first capacitor being much larger than that of the second capacitor, the first terminal and the second terminal of the first capacitor being connected to the second power supply and the first terminal of the second capacitor respectively, the second terminal of the second capacitor being connected to ground, the common node of the second terminal of the first capacitor and the first terminal of the second capacitor being connected to the drain of said switching NMOS transistor, wherein said switching NMOS transistor and said variable capacitance circuit are formed on the same semiconductor substrate.

2. The protection means for preventing power-on sequence induced latch-up according to claim 1, wherein said switching NMOS transistor and said variable capacitance circuit having semiconductor structure comprising:

a p-type substrate;

an N-well formed on said p-type substrate so that a pn junction is formed between said p-type substrate and said N-well;

said NMOS transistor formed on said p-type substrate, the source being connected to ground, the gate being connected to the output terminal of said inverter, the drain extending over the pn junction formed between said p-type substrate and said N-well;

a gate dielectric layer formed on said N-well; and a gate electrode formed on said gate dielectric layer and connected to the second power supply.

3. The protection means for preventing power-on sequence induced latch-up according to claim 1, wherein said voltage-drop circuit comprises a plurality of series-connected diodes, the p terminal of the first diode is connected to the first power supply and the n terminal of the last diode is connected to the input terminal of said inverter.

4. The protection means for preventing power-on sequence induced latch-up according to claim 1, wherein said inverter is a CMOS inverter.

* * * * *